United States Patent [19]

Kressel et al.

[11] 3,988,167
[45] Oct. 26, 1976

[54] SOLAR CELL DEVICE HAVING IMPROVED EFFICIENCY

[75] Inventors: Henry Kressel, Elizabeth; Vikram Lalitchandra Dalal, Princeton, both of N.J.

[73] Assignee: RCA Corporation, New York, N.Y.

[22] Filed: Mar. 7, 1975

[21] Appl. No.: 556,430

[52] U.S. Cl. .................................. 136/89; 29/572
[51] Int. Cl.² ........................................ H01L 31/04
[58] Field of Search ...................... 136/89; 357/30

[56] References Cited
UNITED STATES PATENTS

| | | | |
|---|---|---|---|
| 3,104,188 | 9/1963 | Moncrieff-Yeates | 136/89 |
| 3,331,707 | 7/1967 | Werth | 136/89 |
| 3,361,594 | 1/1968 | Iles et al. | 136/89 |
| 3,888,698 | 6/1975 | Lindmayer et al. | 136/89 |
| 3,907,595 | 9/1975 | Lindmayer | 136/89 |

OTHER PUBLICATIONS
W. P. Rahilly "Hardened Solar Cells," Conference Record, 7th Photovoltaic Specialists Conf. (1968).

Primary Examiner—John H. Mack
Assistant Examiner—Aaron Weisstuch
Attorney, Agent, or Firm—Glenn H. Bruestle; Daniel N. Calder

[57] ABSTRACT

A body of semiconductor material in a solar cell device has a means for collecting electron-hole pairs with an incident surface through which solar radiation enters. The collecting means can be a P N junction between two regions of opposite conductivity of the semiconductor body, or a partially transparent metallic film on the semiconductor body providing a metal to semiconductor material surface barrier rectifying junction. On a surface opposite the incident surface of the collecting means is a non-continuous oxide layer. The oxide layer is non-continuous because of openings extending through the oxide layer to the opposite surface. The openings are distributed across the opposite surface. In the openings at the opposite surface and on the oxide layer is a reflecting contact which functions both as an electrical contact and as a reflector to solar radiation in the semiconductor body.

7 Claims, 3 Drawing Figures

SOLAR CELL DEVICE HAVING IMPROVED EFFICIENCY

BACKGROUND OF THE INVENTION

The present invention relates to solar cells and more particularly to solar cells which provide increased absorption of solar radiation.

A major problem in the field of solar energy collection is the maximization of collection of weakly absorbed solar radiation. Solar radiation comprises radiation of both short and long wavelengths. The absorption coefficient of a semiconductor material depends on the forbidden bandgap widths of the particular semiconductor material. Usually for the semiconductor materials, used in the active region of a solar cell, absorption of the larger wavelength portion of the solar spectrum will be weaker than the short wavelength portion. To adjust for this weak absorption of long wavelength solar radiation it was necessary to make the semiconductor material sufficiently thick to assure absorption. Of course, increasing the thickness of the semiconductor material used in the solar cell increases the cost.

Another problem encountered in solar cells is having electrical contacts on the solar cell which do not interfere with solar radiation incident onto the cell. Solar radiation falling onto a contact will probably be reflected away from the cell, lowering the solar cell's collection efficiency. While it is important to prevent the loss of solar radiation collection, it is also important to have electrical contacts on the solar cell which are conveniently located for the current generated anywhere in the cells' active region. If an electrical contact is only around the periphery of a solar cell it will not interfere with solar radiation incident onto the cell, but current generated within the solar cell will have to travel a greater distance to the contact than current generated at the cells' periphery. The farther current must travel through the semiconductor material to the contact, the larger the resistance it will encounter, and thus the lower the power conversion efficiency.

Therefore, it would be most desirable in the field of solar cells to provide (1) maximization of solar radiation collection without the cost of thick active regions, and (2) electrical contacts not interfering with incident solar radiation but yet are conveniently located to current generated anywhere in the active region.

SUMMARY OF THE INVENTION

A solar cell device having a body of semiconductor material including means for collecting minority carriers generated by the absorption of solar radiation in a semiconductor material, with an incident surface on the collecting means through which radiation enters the body. On a surface of the device opposite the incident surface is a noncontinuous oxide layer, having openings therethrough to the opposite surface in the form of a pattern. A reflecting contact is on the oxide layer and on the opposite surface in the patterned openings.

DETAIL DESCRIPTION OF THE INVENTION

Figure 1:
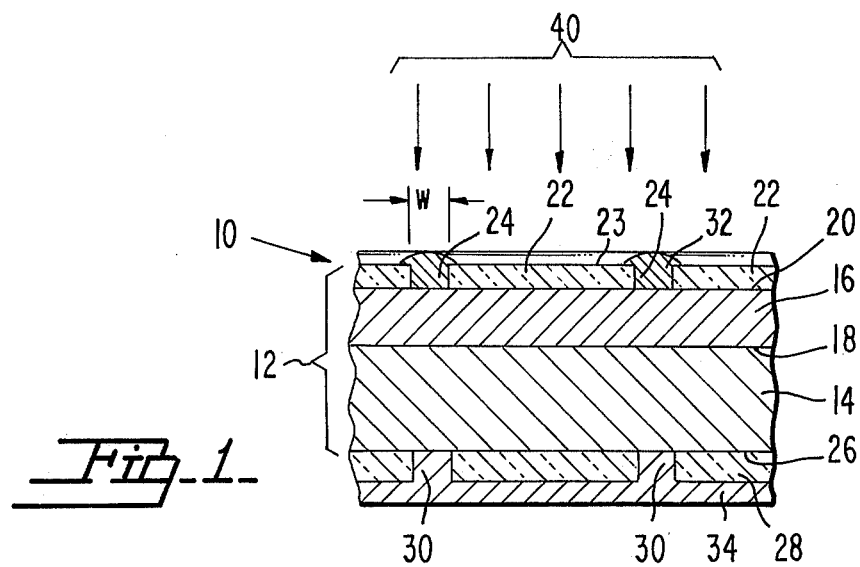
FIG. 1 is a cross-sectional view of a first embodiment of the solar cell device of the present invention.

Referring to FIG. 1, a first embodiment of the solar cell device of the present invention is designated as 10. The solar cell device 10 includes a body semiconductor material 12, such as silicon, having a first region 14 of P-type conductivity and on the first region 14 a second region 16 of N-type conductivity, with a P-N junction 18 therebetween. The body 12 is the active region of the solar cell device 10.

Figure 2:
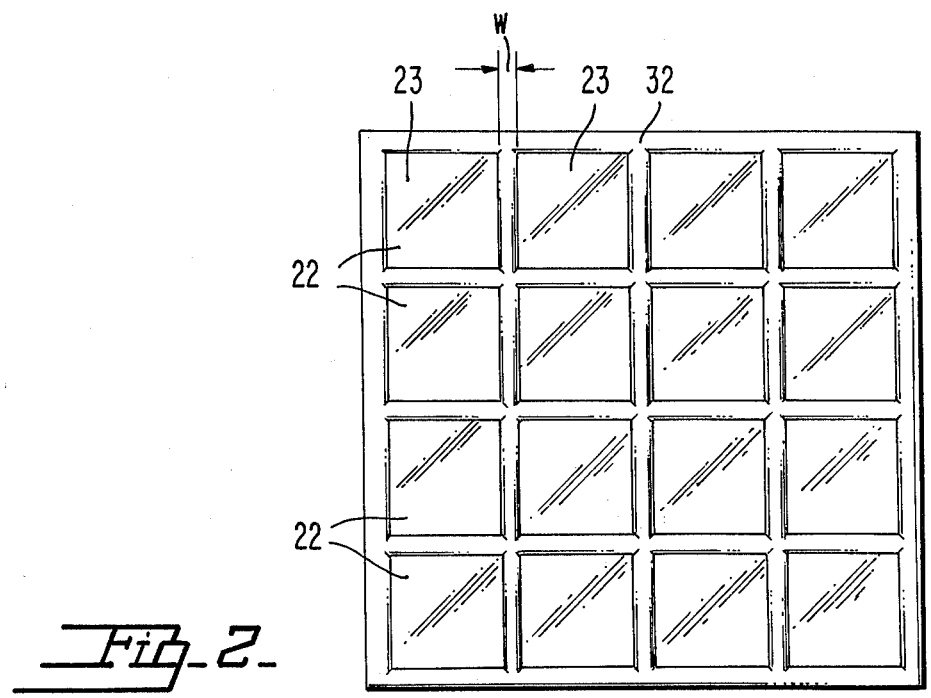
FIG. 2 is a plan view of the patterned contact and first oxide layer of FIG. 1.

Opposite the PN junction 18 the second region 16 has an incident surface 20, which is the surface at which solar radiation enters the semiconductor body 12. On the incident surface 20 is a first non-continuous oxide layer 22 of an oxide material transparent to solar radiation, such as silicon dioxide. The first oxide layer 22 is non-continuous in that it has a plurality of openings 24 extending therethrough to the incident surface 20. The openings 24 are arranged in a pattern across the entire incident surface 20. The pattern of the openings is preferred as a periodic pattern, such as grid pattern. As shown in FIG. 2, the first oxide layer 22 is in the form of a checker board pattern as a result of the grid patterned openings 24 wherein one set of spaced parallel openings 24 intersect another set of spaced, parallel openings 24 at an angle of 90°. However, other patterns of openings can be used to provide the non-continuous oxide layer 22. The openings 24 have a very narrow width, W. The first oxide layer 22 has a surface 23, opposite the incident surface 20.

The first region 14 has a surface 26 opposite the incident surface 20. On the opposite surface 26 is a second non-continuous oxide layer 28, having openings 30 therethrough to the opposite surface 26. The openings 30 are in a grid pattern similar to the grid pattern of the openings 24 in the oxide layer 22 so that the second oxide layer 28 is also in a checker board pattern. Openings 30 like openings 24 are also of a very narrow width, W. The second oxide layer 28 is of an oxide material such as silicon dioxide.

A contact 32 is in the openings 24 and on the incident surface 20, and extends only minutely onto the surface 23 of the first oxide layer 22. Consequently, the contact 32 will assume the shape of the openings 24, forming a grid pattern. The contact 32 is of metallic materials having good electrical properties, such as gold and chromium. Usually, the contact 32 consists of a layer of chromium in contact with the incident surface 20 of the second region 16 and a gold layer on the chromium layer. The chromium layer acts as a wetting agent to assure good adherence of the contact 32 to the second region 16. Further, because the contact 32 extends only minutely onto the surface 23, the contact 23 will prevent only a small amount of solar radiation from falling onto the incident surface 20.

A reflecting contact 34 is on the opposite surface 26 in the openings 30, and on the second oxide layer 28. That portion of the reflecting contact 34 in the openings 30 will assume the shape of the openings 30, typically forming a grid pattern. The reflecting contact 34 is of metallic materials having both good electrical properties and good solar radiation reflective properties, such as gold and chromium. Typically, the reflecting contact 34 will consist of a layer of chromium on both the oxide layer 28 and the first region 14 at the openings 30, with a gold layer on the chromium layer.

The chromium layer acts as a wetting agent to bring about good adhesion of the reflecting contact 34.

In the operation of the solar cell device 10 of the present invention, solar radiation designated by the arrows 40, first falls on the device 10 at the surface 23. The radiation passes through the first oxide layer 22 and into the semiconductor body 12. If the solar radiation passing through the semiconductor body 12 is absorbed by the body 12 an electron-hole pair is created at the point of absorption. Electron carriers which are created in a P-type region, such as the first region 14, and hole carriers which are created in an N-type region, such as the second region 16, are termed minority carriers in these respective regions. In order to have a generation of current within the semiconductor body 12, the minority carriers must reach the PN junction 18. The diffusion length of a minority carrier is the average distance it can travel before it recombines. Therefore, the thickness of both the first and second regions 14 and 16 are typically no thicker than the minority carrier diffusion length for the particular semiconductor material of the semiconductor body 12.

The longer the wavelength of the solar radiation the weaker will be the solar radiation absorption by the semiconductor material of the body 12. That is to say, the solar radiation which is of a longer wavelength, approximately 1 micron or greater for silicon, will have to travel further through a body of semiconductor material to be absorbed, than does solar radiation of a shorter wavelength.

The reflecting contact 34 is responsible for increasing the absorption of solar radiation in the solar cell device 10. Solar radiation which is not absorbed in either the first region 14 or second region 16 passes through the second oxide layer 28, which is transparent to solar radiation, but upon striking the reflecting contact 34 it is reflected back into the semiconductor body 12 for a second pass. Thus, one of the functions of the reflecting contact 34 is to reflect unabsorbed solar radiation back into the body 12 thereby improving the possibility for absorption.

The second oxide layer 28 indirectly is responsible for increasing the device 10 absorption of solar radiation. If the reflecting contact 34 were in intimate contact with the first region 14 instead of the second oxide layer 28, in the deposition of the reflecting contact 34 a thin alloy layer would form between the reflecting contact and the semiconductor material of the first region 14. Such an alloy layer will usually itself absorb solar radiation incident onto it, resulting in the loss of solar radiation which will not be absorbed within the semiconductor material of body 12. Wherever the second oxide layer 28 is an intermediate between the first region 14 and the reflecting contact 34, no alloy layer, abosorbing solar radiation, is formed. Therefore, the alloy layer will only be formed where reflecting contact 34 is in openings 30 and on the first region 14, which accounts for only a small portion of the first region 14 at the opposite surface 26.

Solar radiation not absorbed in body 12 during the first pass may be absorbed during the second pass, that is, after it has been reflected off the reflecting contact 34. The incident surface 20 is a boundary between two different materials, i.e., the oxide layer 22 and second region 16, and according to principles of optics well known in the art, it may be partially reflecting to both solar radiation 40 traveling from the atmosphere and unabsorbed solar radiation in the body 12. If during the second pass through the body 12 the solar radiation is not absorbed, some of the unabsorbed solar radiation incident onto the first oxide layer 22, at the incident surface 20 may again be reflected back into the body 12. Thus, for some unabsorbed solar radiation more than two passes through the body 12, is possible in the solar cell device 10.

As is well known in the art, surface recombination velocity at the free surface of a semiconductor body is high. In order to lower the surface recombination velocity at both the incident surface 20 and opposite surfaces 26, both first and second oxide layers 22 and 28 can be provided to function as passivation layers, such as by being thermally grown onto the surfaces 20 and 26. With the surface recombination velocity reduced at both incident surface 20 and opposite surface 26, the possibility of minority carriers recombining at the surfaces 20 and 26 is reduced, thereby increasing solar cell device 10 efficiency.

Both contact 32 and reflecting contact 34 fuunction as electrical contacts to the second region 16 and the first region 14, respectively. As previously stated, the openings 24 and 30 are of a very narrow width, W, and the contact 32 and a portion of reflecting contact 34 on the opposite surface 26 assumes the shape of the openings 24 and 30, respectively. Since the contact 32 and a portion of the reflecting contact 34 are patterned so as to be distributed across the incident surface 20 and the opposite surface 26, respectively, the current generated in the body 12 is always close to a portion of the contact so as to encounter less electrical resistance in traveling out of the body 12. In addition to providing a convenient electrical path for current generated in body 12, the patterned shape of the contact 32 allows most of the light incident on surface 23 to reach the semiconductor material of body 12, while the shape of the reflecting contact 34 allows it to reflect back into body 12 most of the unabsorbed solar radiation incident onto it.

The exact dimension of the width, W, of each grid in the grid pattern of contact 32 and reflecting contact 34, and their spacing apart, is a function of the resistivity of the semiconductor material of the body 12. The higher the resistivity of the semiconductor material, the wider will be the width, W, and the closer the spacing apart, in order to provide a current path of low resistance. Typically, for silicon the width, W, of each grid in the grid pattern of contact 32 and reflecting contact 34, will be approximately 2 mils, with each grid spaced about 100 mils apart from other grids extending in the same direction.

In the fabrication of the solar cell device 10 of the present invention, a flat semiconductor wafer comprising the first and second regions 14 and 16 can be formed by state of the art epitaxy or diffusion techniques. The thickness of the first region 14 is adjusted to approximate the diffusion length of an electron carrier in the semiconductor material of the first region 14, while the thickness of the second region 16 is adjusted to approximate the diffusion length of a hole carrier in the semiconductor material of the second region 16. After the flat wafer is formed an oxide layer is thermally grown on the wafer. The oxide layer on the edges of the flat wafer are than etched off so that only the first and second oxide layers 22 and 34 remain. Next, the openings 24 and 30 are formed into the oxide layers by utilizing state of the art masking and photoresist techniques. Then reflecting contact 34 is formed by first depositing, by vacuum evaporation, a 100A layer of chromium onto the first region 14 at the openings 30, and onto the second oxide layer 28. Secondly a layer of gold is deposited by vacuum evaporation onto the chromium layer, filling in the openings 30. Contact 32 is formed by first depositing a chromium and then gold layer on the second region 16 at openings 24, and onto the first oxide layer 22, as was done to form the reflecting contact 34. Finally, by using state of the art photoresist technology the chromium and gold layers deposited on the first oxide layer 22 are etched away so that only contact 32, occupying the openings 24, remains.

In the description of the solar cell device 10 the first region 14 is of P-type conductivity and the second region 16 is of N-type conductivity, but it is anticipated by the present invention that the conductivities of the first and second regions can be opposite from what has been described. It is also anticipated by the present invention that the openings 24 and 30 need not be in a grid pattern. The openings 24 and 30, and consequently contact 32 and the portion of reflecting contact 34 on the first region 14, can be in any pattern that is distributed across the surfaces 20 and 26, such as concentric circles radiating out of the center of the device 10 and connected by a common contact. The pattern of contact 32 and reflecting contact 34 may be periodic across the surfaces 20 and 26.

It is desirable in the solar cell device 10 that the pattern of the contact 32 and the reflecting contact 34 be aligned, so as to minimize losses of solar radiation that could possibly be absorbed. Contact 32 prevents solar radiation which first strikes it from traveling into the semiconductor body 12. Unabsorbed solar radiation in the body 12 incident onto the patterned portion of reflecting contact layer 34 at the opposite surface 26 will very possibly not be reflected back into the body 12. As mentioned previously, a metal on a semiconductor material may form an alloy interface, which itself absorbs incident radiation. Thus, even though solar radiation first striking the contact 32 is prevented from entering the body 12, this loss is minimized by aligning the patterns, since the possibility of unabsorbed radiation being reflected back into body 12 is very poor if such radiation is incident onto the patterned portion of reflecting contact 34. In essence, alignment of the patterns minimizes that area of the device 10, as viewed by incident solar radiation, having undesirable qualities.

While it is implicit from the description of the contact pattern previously given that both contact 32 and reflecting contact 34 be of the same pattern, it is anticipated by the present invention that they need not be of the same pattern.

Figure 3:
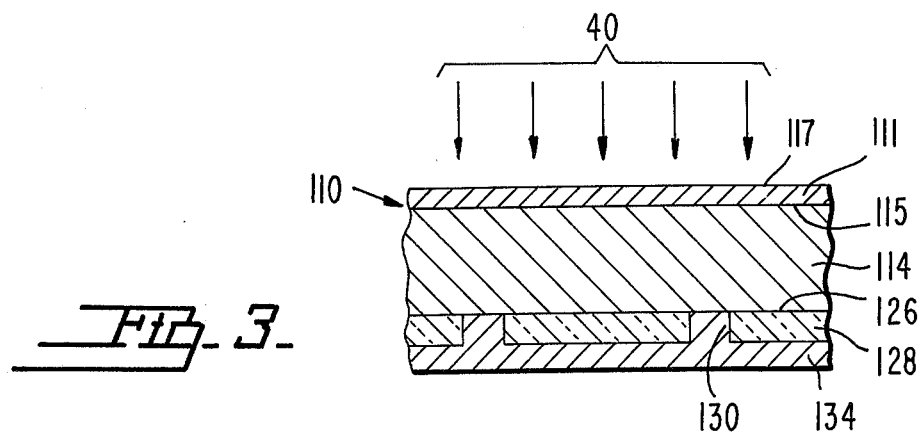
FIG. 3 is a cross-sectional view of a second embodiment of the solar cell device of the present invention.

Referring to FIG. 3, a second embodiment of the solar cell device of the present invention is designated as 110. In the solar cell device 110 a metallic film 111 is on a surface of a semiconductor body 114, having an interface 115 therebetween. The metallic film 111 has a surface 117 opposite the interface 115. Surface 117 is the surface at which solar radiation is incident onto the metallic film 111. The semiconductor body 114 is the active region of the device 110. The metallic film 111 is thin so as to be partially transparent to solar radiation 140, and the semiconductor body 114 is typically of a semiconductor material such as silicon, of N-type conductivity. Typically, the metallic film 111 is of a metal which forms a surface barrier junction, such as gold or platinum.

On an opposite surface 126 of the semiconductor body 114, opposite the interface 115, is a non-continuous oxide layer 128, having openings 130 the same as the first oxide layer 28 and openings 30 of the first embodiment. On the oxide layer 128 and on the semiconductor body 114 at the openings 130 is a reflective contact 134, the same as the reflective contact 34 in the first embodiment of the present invention. The pattern of the openings 130, and thus, that portion of the reflective contact 134 in contact with the semiconductor body 114 can be in any pattern that is distributed across and in contact with the semiconductor body 114, as was described in the solar cell device 10.

Well known in the semiconductor art, is that a metal film can be provided on a semiconductor body resulting in a metal to semiconductor material surface barrier rectifying junction. Such a barrier at the interface of a metal film and semiconductor body is termed a Schottky barrier. Typically, the semiconductor body is of a semiconductor material such as silicon, germanium or a group III-V semiconductor compound. It is intended in the second embodiment of the present invention to have a Schottky barrier at the interface 115 and extending into the semiconductor body 114.

In the operation of the second embodiment of the present invention some of the solar radiation striking the incident surface 117 will pass through the partially transparent metallic film 111 and travel into the semiconductor body 114. While in the semiconductor body 114, some of the solar radiation will be absorbed, forming electron-hole pairs. Depending on the conductivity of the semiconductor body 114, holes or electrons with sufficient energy, traveling toward the Schottky barrier, will go over the barrier and generate a current.

Solar radiation which has not been absorbed in the semiconductor body 114 will strike the reflecting contact 134 and be reflected back into the semiconductor body 114. If in being reflected back into the semiconductor body 114 the solar radiation is still not absorbed, it will strike the partially transparent metallic film 111. Since metallic film 111 is only partially transparent to solar radiation, only a portion of the solar radiation striking it will be reflected back into the semiconductor body 114. Thus, there is the possibility of unabsorbed solar radiation making more than two passes through the semiconductor body 114 of the solar cell device 10.

The reflecting contact 134 provides an electrical contact which is distributed across the semiconductor body 114 to provide generated current with a low resistive path out of the semiconductor body 114. Since the partially transparent metallic film 111 is continuous over the semiconductor body 114 it may provide even a lower resistance path to generated current than the reflecting contact 134, depending on the resistivity of the metal used and thickness of the partially metallic film 111.

In the fabrication of the solar cell device 110 a wafer of a semiconductor material such as silicon is cut from an ingot of semiconductor material. After cleaning, lapping and polishing the wafer to form the semiconductor body 114, a thin metallic layer of material such as gold or platinum is deposited on a surface of the semiconductor body 114 by vacuum evaporation to form the partially transparent metallic film 111. The metallic film 111 is on the order of about 110 A in thickness to assure it will be partially transparent to solar radiation. Fabrication of the solar cell device 110 is completed by depositing the oxide layer 128 and reflecting contact 134 on a surface of the semiconductor body 114 opposite the partially transparent metallic film 111, as discussed in the fabrication of the first embodiment of the present invention.

The solar cell devices 10 and 110 offers the advantage of at least a second pass for unabsorbed solar radiation through the active region, and electrical contacts which provide the current generated in the active region with a low resistive path out of the active region.

We claim:

1. A solar cell device comprising:
    a body of semiconductor material having means for collecting minority carriers generated by the absorption of solar radiation in the body,
    an incident surface on the collecting means, through which radiation enters the collecting means,
    a non-continuous oxide layer on a surface of the collecting means opposite the incident surface, the oxide layer having openings therethrough to the opposite surface, the openings being in the form of a pattern distributed across the opposite surface,
    a reflecting contact on the oxide layer and on the opposite surface in the patterned openings,
    a non-continuous oxide layer on the incident surface, the oxide layer having openings therethrough to the incident surface, the openings being in the form of a pattern, the patterned openings of the oxide layers on the opposite surface and the incident surface being of the same pattern and in alignment with each other, and
    a contact on the incident surface in the patterned openings.

2. The solar cell device in accordance with claim 1 wherein the collecting means of the body of a semiconductor material comprises a first region of one conductivity type, a second region of an opposite conductivity type on the first region, with a PN junction therebetween.

3. The solar cell device in accordance with claim 1 wherein the pattern of the openings in both oxide layers is in the shape of a grid.

4. The solar cell device in accordance with claim 3 wherein the pattern of the openings in both oxide layers is periodic in shape.

5. The solar cell device in accordance with claim 4 wherein the first region is of a P-type conductivity and the second region is of an N-type conductivity.

6. The solar cell device in accordance with claim 5 wherein the oxide layers are of silicon dioxide.

7. The solar cell device in accordance with claim 6 wherein both the contact and reflecting contact are of both chromium and gold.

* * * * *